(12) United States Patent
Kornblum et al.

(10) Patent No.: US 6,522,206 B1
(45) Date of Patent: Feb. 18, 2003

(54) ADAPTIVE FEEDBACK-LOOP CONTROLLERS AND METHODS FOR RAPID SWITCHING OF OSCILLATOR FREQUENCIES

(75) Inventors: John J. Kornblum, Greensboro, NC (US); David T. Crook, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/973,281

(22) Filed: Oct. 9, 2001

Related U.S. Application Data

(60) Provisional application No. 60/307,276, filed on Jul. 23, 2001.

(51) Int. Cl.[7] ............................................... H03L 7/00
(52) U.S. Cl. ......................... 331/1 A; 331/14; 331/18; 331/DIG. 2
(58) Field of Search ............................ 331/1 A, 10, 11, 331/12, 14, 18, DIG. 2

(56) References Cited

U.S. PATENT DOCUMENTS

| | | | |
|---|---|---|---|
| 5,838,202 A | * | 11/1998 | Kosiec et al. ............... 331/1 A |
| 5,920,233 A | * | 7/1999 | Denny ........................ 331/14 |
| 6,222,421 B1 | | 4/2001 | Kiyose |
| 6,252,466 B1 | | 6/2001 | Kawamura |
| 6,329,882 B1 | * | 12/2001 | Fayneh et al. ............... 331/10 |

OTHER PUBLICATIONS

Byrd, David, et al., Application Note 1000, National Semiconductor Corporation, Jul., 1995, pp. 1–5.
LM2306/LMX2316/LMX2326 Low Power Frequency Synthesizer Data Sheet, National Semiconductor Corporation, Apr., 2001, pp. 1–18.

* cited by examiner

*Primary Examiner*—Robert Pascal
*Assistant Examiner*—Joseph Chang
(74) *Attorney, Agent, or Firm*—Koppel, Jacobs, Patrick & Heybl

(57) ABSTRACT

Feedback methods and systems are provided to achieve rapid switching of oscillator frequencies without compromising operational feedback loop bandwidths that filter out spurious tones and phase noise to thereby enhance loop spectral and noise performance. The methods respond to frequency changes in a reference signal by providing an open-loop drive current to drive a feedback signal towards the reference signal. The drive current is terminated and the feedback control loop closed when the feedback signal is within a predetermined acquisition range of the reference signal. This is determined by successively comparing a feedback frequency of the feedback signal to a destination frequency of the reference signal over a comparison window of time. The invention also provides a feedback control system that practices the invention's methods.

31 Claims, 5 Drawing Sheets

ADAPTIVE FEEDBACK-LOOP CONTROLLERS AND METHODS FOR RAPID SWITCHING OF OSCILLATOR FREQUENCIES

CROSS REFERENCES TO RELATED APPLICATIONS

This application claims the benefit of U.S. Provisional Application Ser. No. 60/307,276 filed Jul. 23, 2001.

BACKGROUND OF THE INVENTION

1. Field of the Invention

The present invention relates generally to feedback control systems.

2. Description of the Related Art

A phase-locked loop is a particular type of feedback control system that maintains a feedback signal in a specific phase relationship with a reference signal. Phase-locked loops are vital parts of a wide variety of electronic systems (e.g., frequency synthesizers, analog and digital modulators, clock recovery circuits and direct digital synthesizers) and the basic structure of conventional phase-locked loops has been described (e.g., see U.S. Pat. Nos. 6,222,421 and 6,252,466 respectively issued Apr. 24, 2001 and Jun. 26, 2001).

Conflicting demands, however, are placed on the selection of loop bandwidth for conventional phase-locked loops. The loop bandwidth is preferably set low to filter out spurious tones and reduce phase noise to thereby improve system spectral and noise performances. The loop bandwidth, however, is preferably set high to achieve rapid switching time in response to a frequency change of the reference signal. Accordingly, the selection of loop bandwidth has typically been a compromise which degrades one or more phase-locked loop performance parameters.

SUMMARY OF THE INVENTION

The present invention is directed to feedback methods and systems that achieve rapid switching of oscillator frequencies without compromising operational feedback loop bandwidths that filter out spurious tones and phase noise to thereby enhance loop spectral and noise performance.

These goals are realized with feedback methods that respond to frequency changes in a reference signal by:
a) providing an open-loop drive current to drive a feedback signal towards the reference signal,
b) over a comparison window of time, successively comparing a feedback frequency of the feedback signal to a destination frequency of the reference signal to effect a determination that the feedback frequency has entered a predetermined acquisition range of the destination frequency; and
c) terminating the drive current and closing the feedback control loop to lock the feedback signal to the reference signal.

In an embodiment of the invention, the determination is effected when at least one count of rising and falling edges of the feedback signal obtains a predetermined relationship with at least one count of rising and falling edges of the reference signal.

The invention also provides a feedback control systems that practice the invention's methods.

The novel features of the invention are set forth with particularity in the appended claims. The invention will be best understood from the following description when read in conjunction with the accompanying drawings.

DETAILED DESCRIPTION OF THE INVENTION

Figure 1:
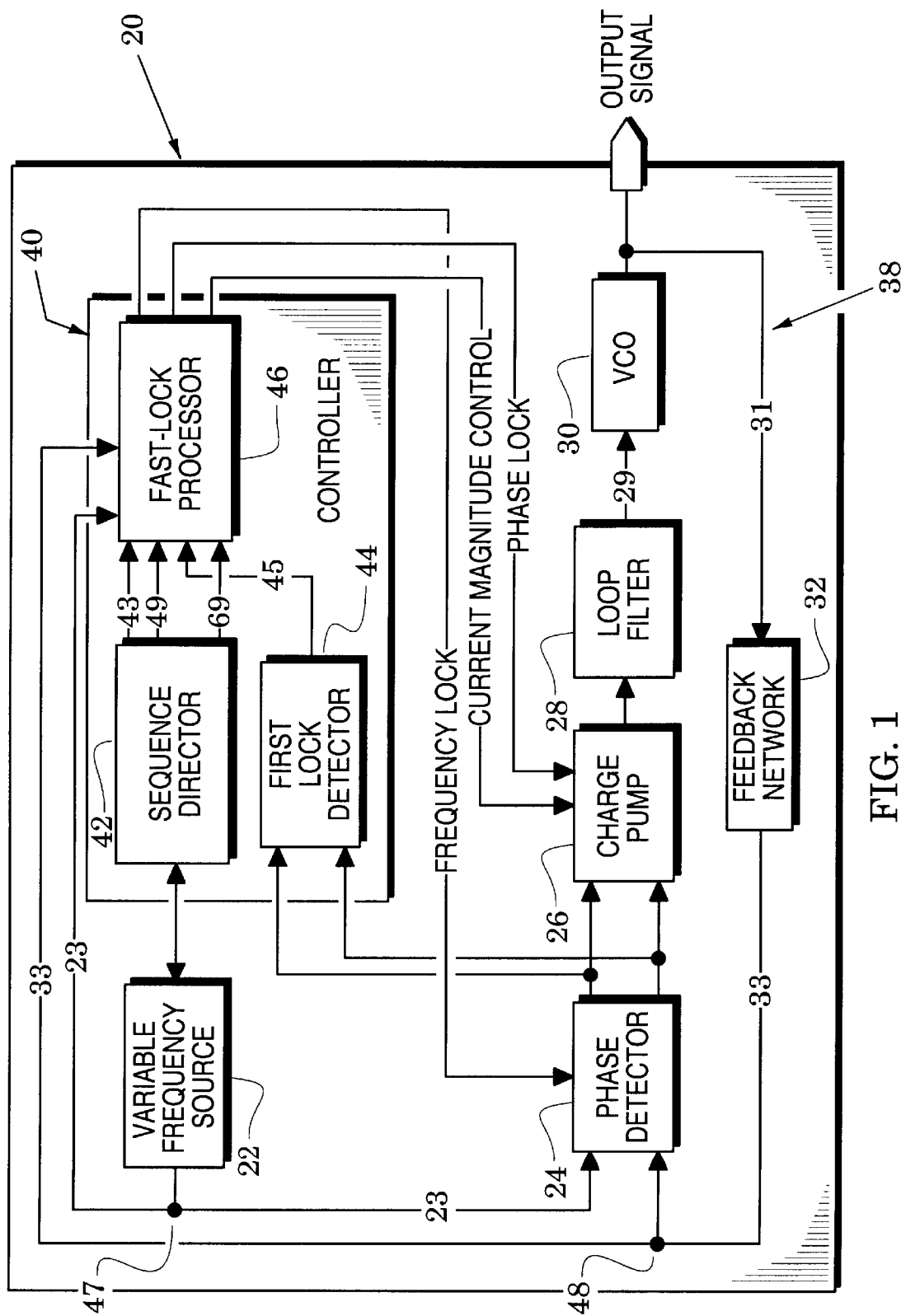
FIG. 1 is a block diagram of a feedback control system of the present invention.

Methods and systems of the present invention enable rapid switching times of feedback control systems without compromising their locked operational performance. The methods of the invention can be practiced with a feedback control system embodiment 20 that is shown in FIG. 1. Operation of the feedback control system is directed by an adaptive feedback-loop controller. A description of this controller will be best understood by preceding it with the following investigation of the feedback control system of FIG. 1.

The feedback control system 20 includes a variable-frequency source 22 (e.g., a direct digital synthesizer, a fast hopping wide-loop phase-locked loop or other fast-switching frequency source) which provides a loop reference signal 23 to a phase detector 24. A charge pump 26 provides closed-loop charge pump currents $I_{c-l}$ to a loop filter 28 in response to signals from the phase detector. A voltage-controlled oscillator (VCO) 30 generates an output signal 31 whose frequency corresponds to a voltage signal 29 that is delivered from the loop filter. The loop output signal 31 may be processed through a feedback network 32 (e.g., a frequency divider or a mixer) and is delivered as a feedback signal 33 to the phase detector for comparison to the loop reference signal.

In operation, the output signal of the phase detector 24 corresponds to the phase difference between the loop reference signal 23 and the feedback signal 33 and negative feedback action urges the VCO's output signal 31 to an output frequency that is phase-locked to the reference signal from the variable frequency source 22. In this locked operational state, the charge pump 26 responds to the phase detector 24 by providing closed-loop charge pump currents $I_{c-l}$ that charge and discharge capacitive elements of the loop filter 28 as required to maintain phase lock between the VCO's output signal 31 and the reference signal 23.

The phase detector, charge pump, loop filter, VCO and feedback network thus form a feedback control loop 38 and their combined transfer functions form a loop transfer function which has a steady—state operational bandwidth (also referred to herein as the narrow bandwidth).

Operation of the feedback control system 20 is coordinated by an adaptive feedback-loop controller 40 which includes a sequence director 42 that provides signals that sequence the reference signal 23 of the variable frequency source 22 from a current reference signal which has a current frequency to subsequent reference signals which have subsequent destination frequencies. The sequence director 42 retains knowledge of the current loop frequency and subsequent destination frequencies and thus also has information on the direction of each subsequent frequency change which it provides as a direction indicator signal 43. In addition, a first lock detector 44 of the feedback-loop controller 40 provides a lock monitor signal 45 in response to output signals of the phase detector 24.

Finally, a fast-lock processor 46 of the feedback-loop controller 40 receives the loop reference signal 23 from system node 47 and the feedback signal 33 from system node 48. The processor 46 also receives the lock monitor signal 45 from the first lock detector 44 and the direction indicator 43 and a filter enable signal 49 from the sequence director 42. The fast-lock processor 46 subsequently couples a frequency lock signal to the phase detector 24 and a current magnitude-control signal and a phase lock signal to the charge pump 26.

Figure 2:
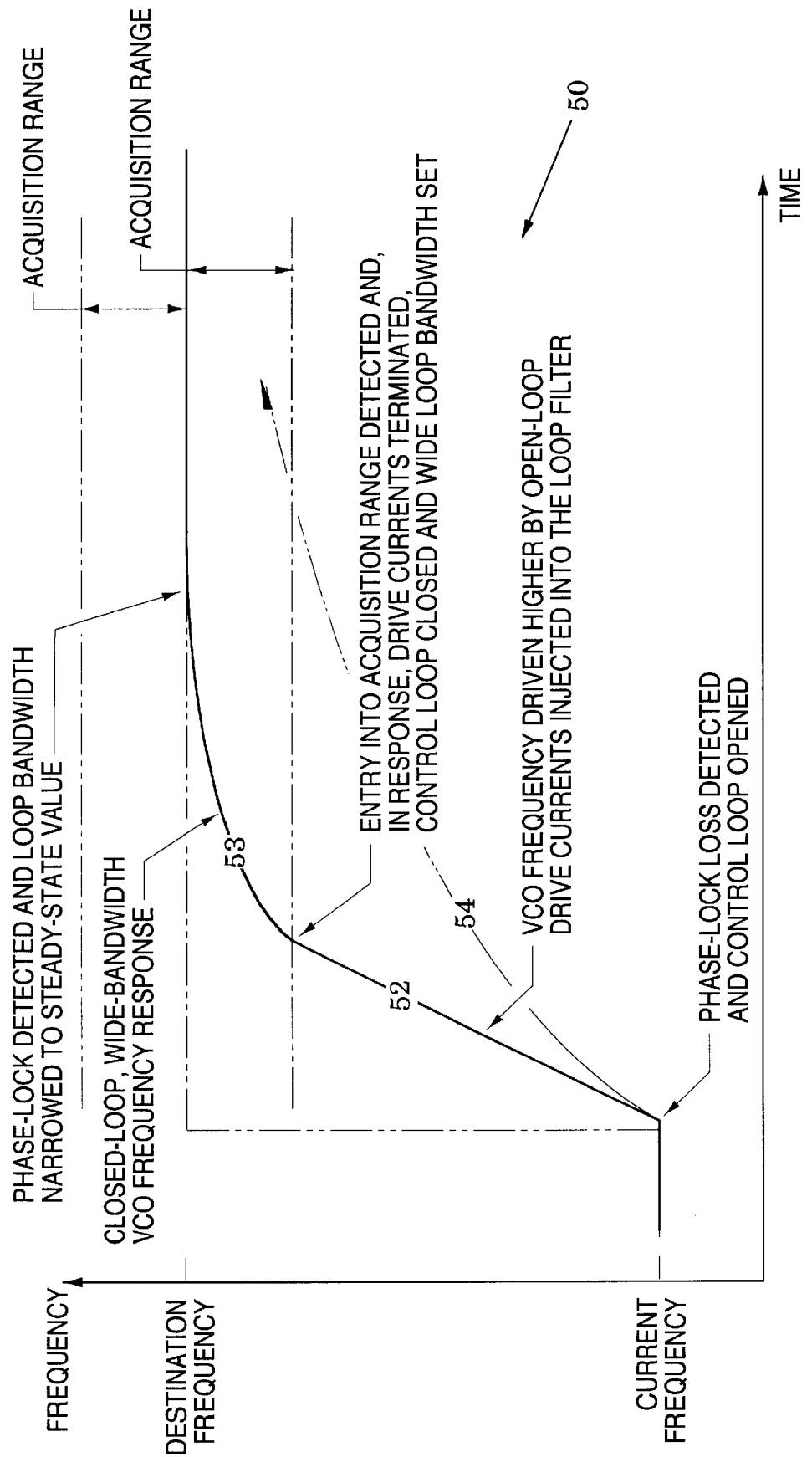
FIG. 2 is a frequency graph that illustrates selected process steps of the feedback control system of FIG. 1.

Attention is now directed to a general operational description of operation of the adaptive feedback-loop controller 20 with reference to FIG. 1 and to the corresponding frequency graph 50 of FIG. 2. Attention will subsequently be directed to a more detailed operational description with reference to FIGS. 3–5.

Prior to provision of the subsequent reference signal from the variable frequency source 22, the phase detector 24 compares the phase of the feedback signal 33 on system node 48 with the phase of the current reference signal 23 on system node 47 and, in response, generates a control signal (which may, as shown in the embodiment of FIG. 1, comprise two signals to enhance control of the charge pump). In response to this control signal, the charge pump 26 supplies closed-loop charge pump currents $I_{c-l}$ to the loop filter 28 to thereby provide a VCO control voltage 29 that maintains phase lock between the VCO's output signal 31 and the reference signal 23 which is shown as the current frequency in the graph 50 of FIG. 2.

Upon initiation of the subsequent reference signal (which has a destination frequency as shown in FIG. 2), the phase detector 24 generates a phase error signal that is detected by the first lock detector 44 which alerts the fast-lock processor 46 to the fact that the loop is no longer phase locked (this alert can also be directly supplied by the variable frequency source 22).

In response, the fast-lock processor sets the frequency lock signal in a state that effectively turns off output drivers of the phase detector 24 (e.g., with transistor switches or gates). The fast-lock processor 46 also sets the current magnitude-control signal in an open-loop condition which commands the charge pump 26 to replace closed-loop charge pump currents $I_{c-l}$ to the loop filter 28 with open-loop drive currents $I_{o-l_{dr}}$. The magnitudes of the open-loop drive currents $I_{o-l_{dr}}$ are programmable via the current magnitude-control signal.

The feedback control loop 38 has thus been placed in an open-loop state (as indicated in FIG. 2) and a predetermined magnitude and polarity of open-loop drive current $I_{o-l_{dr}}$ provided to capacitive elements of the loop filter 28 which, in response, rapidly charge (or discharge) at a rate that is dependent on the programmed open-loop drive current and on parameter values of feedback elements of the loop filter. The frequency of the VCO 30 is thus rapidly driven towards the destination frequency of the subsequent reference signal as shown by a driven path 52 in the graph 50 of FIG. 2.

As the VCO frequency on system node 48 rapidly approaches the destination frequency on system node 47, these frequencies are continuously compared in the fast-lock processor 46. When the feedback control loop 38 is opened, the feedback control system 20 thus effectively forms a frequency detection loop which includes the fast-lock processor.

The fast-lock processor 46 determines when the VCO frequency is within a predetermined range of the destination frequency. The predetermined range is preferably chosen to place the feedback signal 33 within the acquisition range of the feedback control loop 38, i.e., in this range, the transfer function of the feedback control loop will automatically pull the VCO 30 into phase lock with the subsequent reference signal. The acquisition range is shown in the frequency graph 50 of FIG. 2.

When the feedback signal 33 reaches the acquisition range of the destination frequency, the fast-lock processor 46 sets the frequency lock signal in a state that recouples the phase detector 24 to the charge pump 26 and sets the current magnitude-control signal in a state that modifies the charge pump 26 (e.g., with transistor switches or gates, current sources and/or current mirrors) to have an increased transfer function (relative to its steady-state transfer function). In particular, the charge pump is modified to increase its closed-loop charge pump current $I_{c-l}$ in response to a unit phase error from the phase detector (i.e., increase relative to its steady-state condition).

This increased transfer function modifies the loop transfer function so as to temporarily increase the bandwidth of the feedback control loop 38 above its intended steady-state operational bandwidth (referred to above as the narrow bandwidth) which is generally chosen to enhance loop performance parameters (e.g., rejection of spurious signals). The wider loop bandwidth substantially reduces (relative to the steady-state loop bandwidth) the time for the feedback control loop 38 to pull the VCO 30 (along the frequency path 53 of FIG. 2) from a frequency lock condition to a final phase lock condition. The magnitudes of the closed-loop charge pump currents $I_{c-l}$ (during this wide bandwidth state) are also programmable in the feedback-loop controller 40.

During the wide-bandwidth state, the first lock detector 44 monitors the loop phase error (as indicated by the output of the phase detector 24) as it reduces to a predetermined magnitude. When this level is reached, the first lock detector signals the fast-lock processor 46 with the lock monitor signal 45. After it determines that this is a valid signal (i.e., a stable signal), the fast-lock processor 46 provides the phase lock signal which sets the current magnitude-control signal in a state that modifies the transfer function of the charge pump 26 to its steady-state narrow-bandwidth state condition as indicated in the graph 50 of FIG. 2. In particular, the charge pump is modified to provide its steady-state output current $I_{cp}$ in response to a unit phase error from the phase detector 24.

These transitions from an open-loop state to a wide-bandwidth state and finally to a steady-state narrow-bandwidth state essentially constitute an adaptive loop control method which enhances rapid switching of oscillator frequencies without compromising closed-loop performance parameters. In absence of the invention, the frequency of the VCO (30 in FIG. 1) would respond only to a closed-loop feedback signal and, accordingly, it would slowly approach the destination frequency as indicated by the exemplary broken-line frequency path 53 in FIG. 2.

Figure 3:
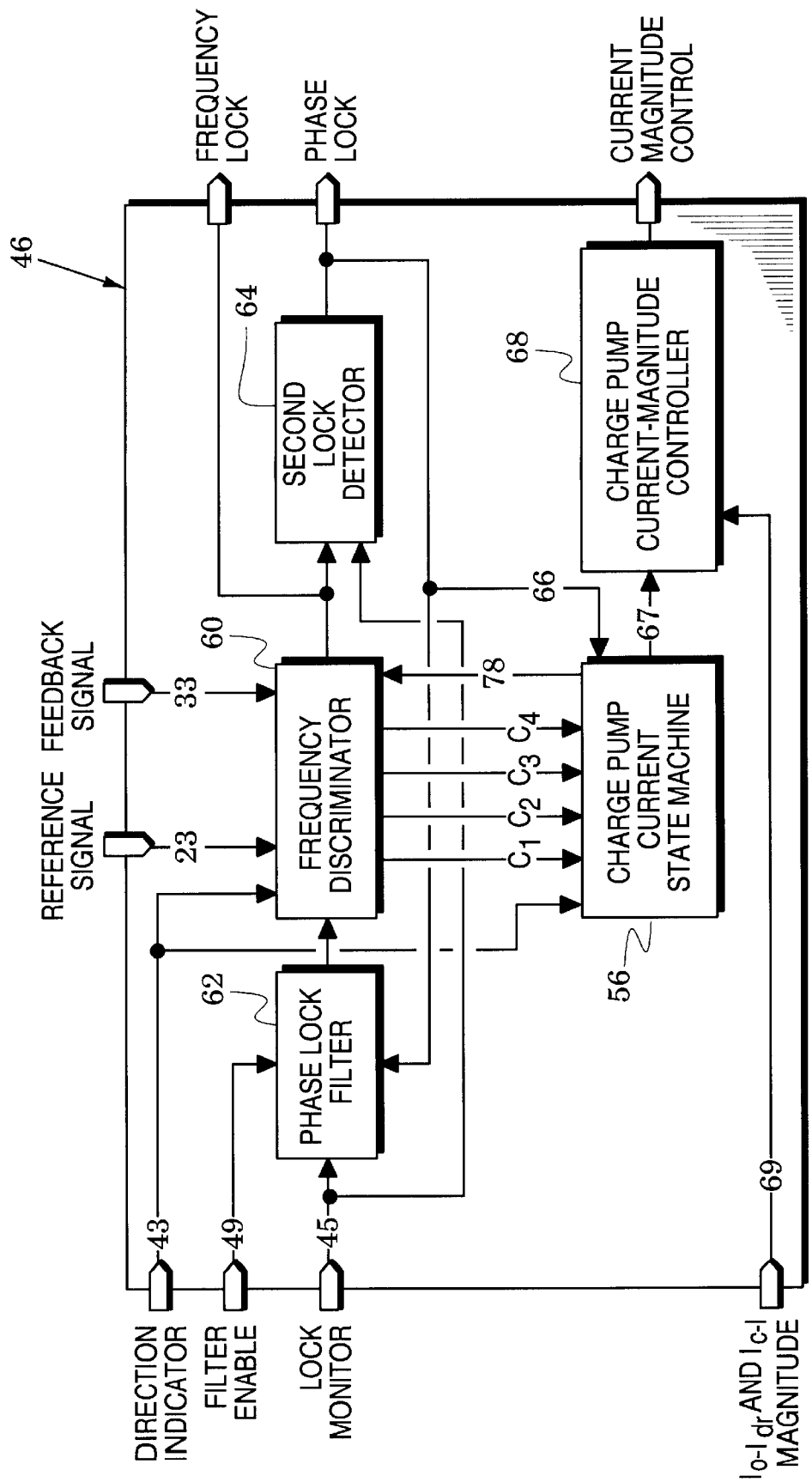
FIG. 3 is a block diagram of an adaptive feedback-loop controller in the system of FIG. 1.

Attention is now directed to structure of the fast-lock processor 46 as shown in FIG. 3. The processor includes a frequency discriminator 60 and a phase lock filter 62 that acts as a gate between the lock monitor signal 45 and the frequency discriminator. The frequency discriminator 60 generates the frequency lock signal (also shown in FIG. 1) and provides it to a second lock detector 64 which also receives the lock monitor signal 45 from the first lock detector (44 in FIG. 1). In response to these two signals, the second lock detector 64 provides the phase lock signal to the phase lock filter 62 and to the phase detector (24 in FIG. 1).

The phase lock filter 62 responds to the lock monitor signal and the filter enable signal 49 from the sequence director (42 in FIG. 1). In particular, the phase lock filter generally blocks the lock monitor signal 45 but passes it to the frequency discriminator 60 when it receives the filter enable signal 49. The phase lock filter again blocks the lock monitor signal 45 when it subsequently receives a valid phase lock signal from the second lock detector 64.

In a significant feature of the invention, the phase lock filter 62 thus supplies the lock monitor signal 45 to the frequency discriminator 60 only when it is required for frequency discrimination. Otherwise, this signal is blocked to thereby effectively suppress spurious and random "out-of-lock" and "in-lock" signals from the first lock detector (44 in FIG. 1) that would otherwise degrade operation of the feedback control system (20 in FIG. 1). Therefore, the lock monitor signal 45 is only provided to the frequency discriminator 60 in a time window (i.e., interval) between occurrence of the filter enable signal 49 and the subsequent phase lock signal.

The frequency discriminator 60 also receives the reference signal 23 (from system node 47 in FIG. 1), the feedback signal 33 (from system node 48 in FIG. 1) and the direction indicator signal 43 (from the sequence detector 42 in FIG. 1) and, in response, provides frequency-comparison signals $C_1$–$C_4$ that enable a charge pump current state machine 66 to generate state signals 67. In response to the state signals 67, a charge pump current-magnitude controller 68 provides the current magnitude-control signals to the charge pump (26 in FIG. 1). The resulting magnitudes of the charge pump currents are programmable via an drive magnitude signal 69 (e.g., an n-bit signal) that is provided, for example, by the sequence director 42 as shown in FIG. 1.

Figure 4:
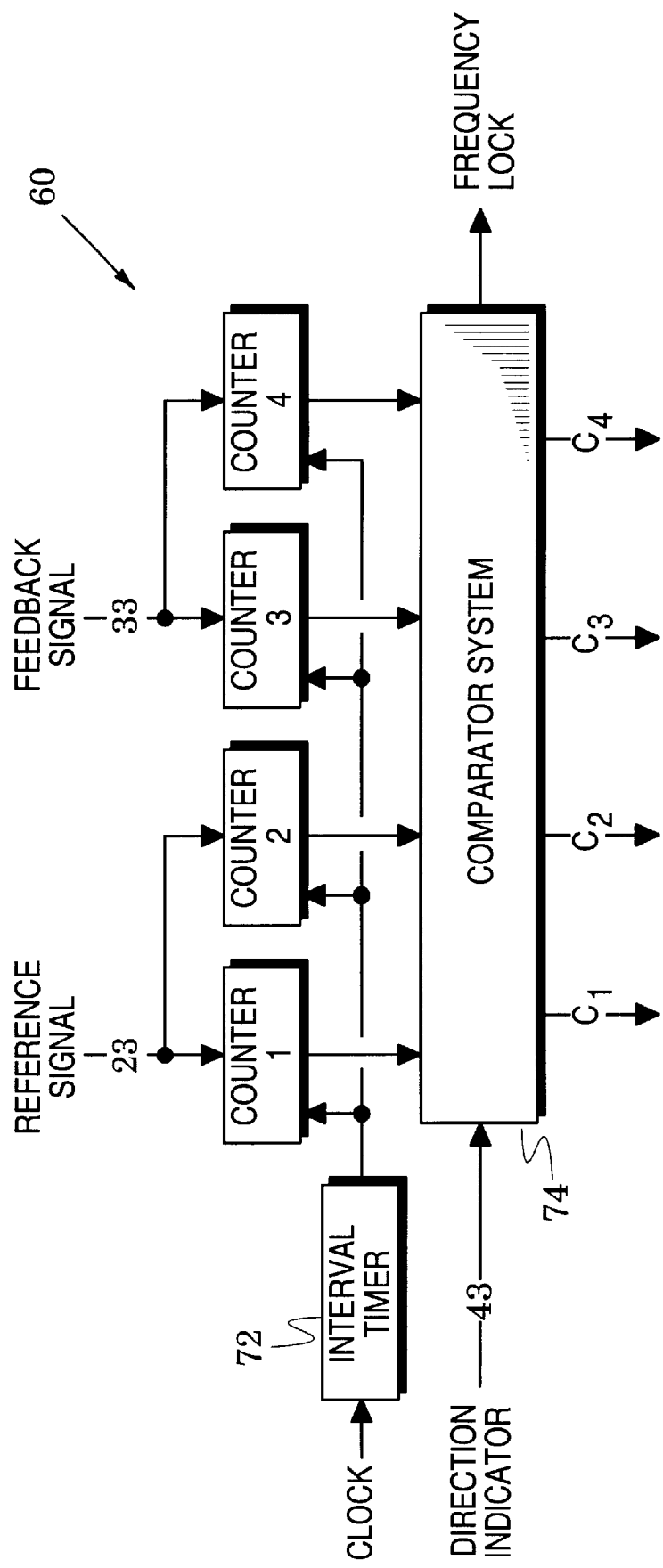
FIG. 4 is block diagram of a frequency discriminator in the feedback-loop controller of FIG. 3.

FIG. 4 shows a frequency discriminator embodiment 60 which includes counters 1 and 2 that respectively count falling and rising edges of the reference signal (23 at system node 47 in FIG. 1) and counters 3 and 4 that respectively count falling and rising edges of the feedback signal (33 at system node 48 in FIG. 1). The count of these counters is initiated and terminated in successive comparison windows that are determined by an interval timer 72 which may be realized with various conventional timer structures such as, for example, a counter that responds to a clock signal. A comparator system 74 generates the frequency-comparison signals $C_1$–$C_4$ (also shown in FIG. 3) in response to the counts of counters 1–4 and to the direction indicator signal (43 in FIG. 3) and supplies the frequency lock signal which is true when any of the frequency-comparison signals $C_1$–$C_4$ are true.

Attention is now directed to an operational description of the fast-lock processor 46 of FIG. 3 after which attention will be directed to an operational description of the frequency discriminator 60 of FIG. 4.

In a locked state of the feedback control system 20 of FIG. 1, the VCO 30 is phase locked to a current reference signal 23 (having a current frequency) from the variable frequency source 22. Accordingly, the output signals of the phase detector 24 do not contain alternating signals (typically, these are pulse-width modulated signals) and, in response, the lock monitor signal 45 from the first lock detector 44 indicates a locked condition. The sequence director 42 does not provide a filter enable signal so that the lock monitor signal 45 is blocked from the frequency discriminator (60 in FIG. 3) during this locked state of the system which is also referred to as the narrow-bandwidth state. In the current state of the frequency lock signal (from the second lock detector 64 of FIG. 3), the phase detector 24 remains coupled to the charge pump 26.

In response to commands from the sequence director 42, the variable frequency source 22 changes its reference signal 23 from the current reference signal with a current frequency to a subsequent reference signal with a destination frequency. At this time, the sequence director 42 of FIG. 1 provides the filter enable signal 49 so that the lock monitor signal 45 is passed through the phase lock filter 62 of FIG. 3 and enables the frequency discriminator 60. The sequence director 42 of FIG. 1 also provides the direction indicator 43 so that the frequency discriminator 60 and the charge pump current state machine 66 of FIG. 3 know whether the destination frequency is above or below the current frequency.

Because none of the frequency-comparison signals $C_1$–$C_4$ go true at this time (operation of the frequency discriminator is described below), the frequency lock signal is placed in a state that causes the phase detector 24 of FIG. 1 to be decoupled from the charge pump 28 so that the feedback control loop 38 is modified to an open-loop condition. Also, the charge pump current state machine 66 of FIG. 3 communicates an open-loop state to the charge pump current-magnitude controller 68 which configures the charge pump to apply an open-loop charge pump drive current $I_{o-l_{dr}}$ to the loop filter 28 whose direction and magnitude are selected to cause the VCO frequency to rapidly approach the destination frequency.

In the open-loop state, the structure of the feedback control system 20 of FIG. 1 functions as a frequency detection loop. Assuming the destination frequency is above the current frequency, at least one of the frequency-comparison signals $C_1$–$C_4$ from the frequency discriminator will go true when the VCO frequency reaches or exceeds the destination frequency. If, instead, the destination frequency is below the current frequency, at least one of the frequency-comparison signals $C_1$–$C_4$ from the frequency discriminator will go true when the VCO frequency reaches or drops below the destination frequency.

In response to either of these occurrences, the frequency discriminator 60 of FIG. 3 changes the state of the frequency lock signal and, in response, the phase detector 24 of FIG. 1 is recoupled to the charge pump, i.e., the feedback control loop 38 is returned to its closed-loop condition. Also in response to the frequency discriminator, the charge pump current state machine 66 reconfigures the state signals 67 to indicate to the charge pump current-magnitude controller 68 that the system is in its wide-bandwidth state state. Accordingly, the charge pump current-magnitude controller 68 configures (via the current magnitude-control signal) the charge pump with a high transfer function (in particular, a high closed-loop charge pump current $I_{c-l}$ per unit phase error) so that the feedback control loop 38 of FIG. 1 has a closed-loop bandwidth greater than its steady-state bandwidth.

Thus, the feedback signal 33 has been positioned within the wide-bandwidth state acquisition range of the loop and the loop's negative feedback rapidly urges the VCO's output frequency to phase lock with the subsequent reference signal 23. At that point, the lock monitor signal 45 from the first lock detector 44 causes the second lock detector 64 of FIG. 3 to provide the phase lock signal. In particular, the frequency lock signal from the frequency discriminator 60 enables the second lock detector 64 which then proceeds to check the condition of the lock monitor signal 45 over successive time periods. When the lock monitor signal remains true over one of these time periods, it is judged to be a valid and stable signal and the second lock detector 64 then provides the phase lock signal.

In response to the phase lock signal, the charge pump 26 of FIG. 1 returns to its steady-state transfer function (i.e., a steady-state closed-loop charge pump current $I_{c-l}$ per unit phase error) so that the feedback control loop 38 is restored to its steady-state bandwidth. Also in response to the phase lock signal, the phase lock filter 62 of FIG. 3 subsequently blocks the lock monitor signal 45 from the frequency discriminator 60. In a significant feature of the invention, these actions of the second lock detector insure that spurious "out-of-lock" indications are subsequently ignored and the feedback control loop 38 remains in its narrow-bandwidth state state.

In this embodiment of the invention, the second lock detector 64 couples the phase lock signal to the charge pump 26 of FIG. 1 to return it to its steady-state transfer function. In another embodiment, the phase lock signal is instead coupled (e.g., via alternate signal path 66 of FIG. 3) from the second lock detector to the charge pump current state machine 66 which, in response, reconfigures the state signals 67 to indicate to the charge pump current-magnitude controller 68 that the system is in its narrow-bandwidth state. The current-magnitude control signal of the charge pump current-magnitude controller 68 then sets the the charge pump back in its steady-state transfer function.

Subsequent to the processes described above, the sequence director 42 of FIG. 1 may command the variable frequency source 22 to change its output signal to yet another subsequent reference signal. At this time, the sequence director provides the direction indicator 43 and the filter enable signal 49. In response, the lock monitor signal is passed through the phase lock filter 62 of FIG. 3 to enable the frequency discriminator 60 and the above-described processes are then repeated until the VCO output signal 31 of FIG. 1 has again been phase-locked (via the feedback signal 33) to the subsequent reference signal 23.

Figure 5:
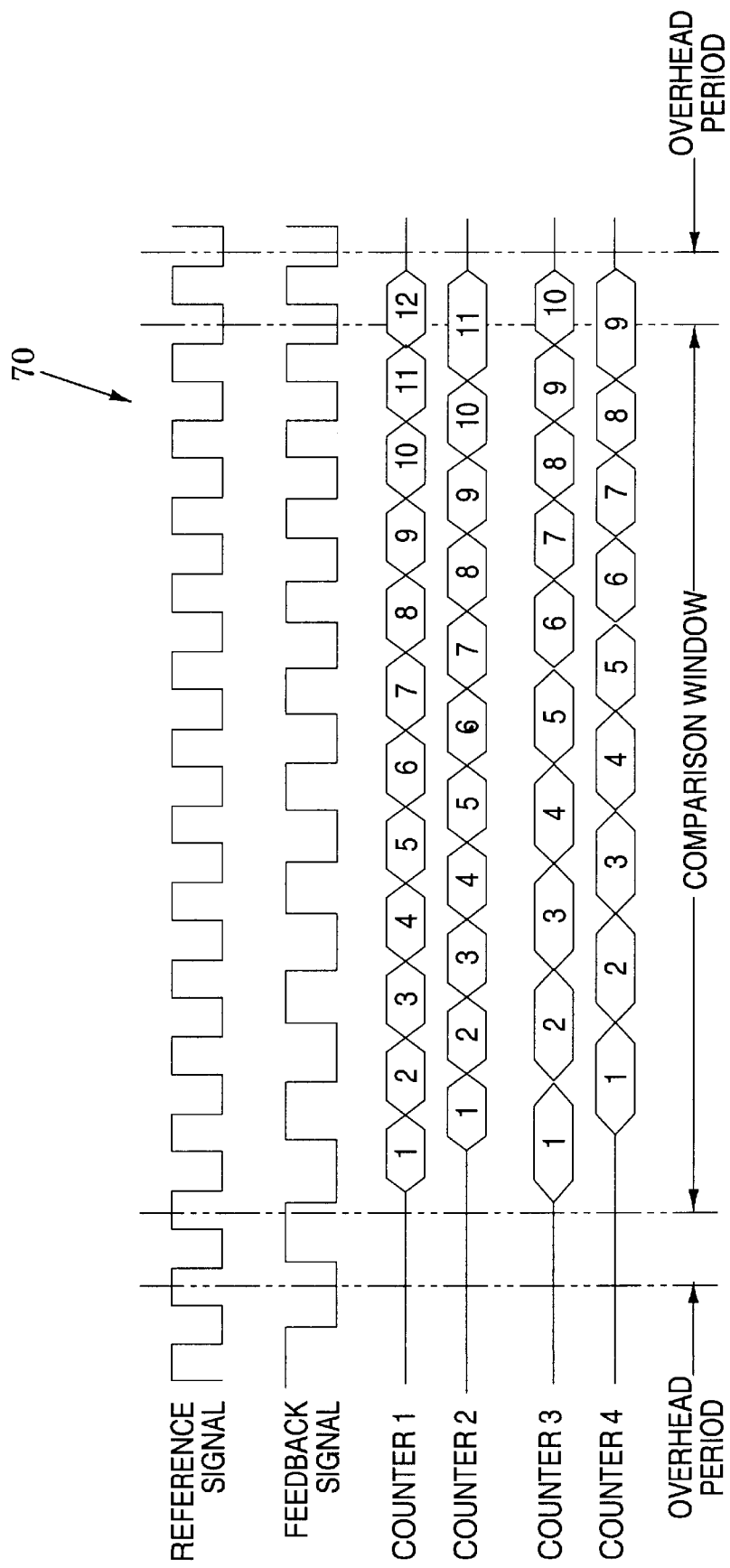
FIG. 5 is an exemplary timing diagram for the frequency discriminator of FIG. 4.

It was noted above that at least one of the frequency-comparison signals $C_1$–$C_4$ from the frequency discriminator 60 will go true at a time when the feedback frequency reaches or exceeds the destination frequency. An operational description of the frequency discriminator 60 of FIG. 4 is facilitated by the timing diagram 70 of FIG. 5. The interval timer 72 of FIG. 4 provides a comparison window to the counters 1–4 and this comparison window is shown in FIG. 5. Although the invention may be practiced with other signal forms, the reference signal and the feedback signal are exemplarily shown as digital signals in FIG. 5.

During this comparison window, counters 1 and 2 respectively count falling and rising edges of the reference signal (23 in FIG. 4). Accordingly, counter 1 reaches a count of 12 and counter 2 reaches a count of 11. Over the same comparison window, counters 3 and 4 respectively count falling and rising edges of the feedback signal (33 in FIG. 4). Accordingly, counter 3 reaches a count of 10 and counter 4 reaches a count of 9.

In the following operational description, it is initially assumed that the comparator system 74 of FIG. 4 has been informed (by the direction indicator 43) that the destination frequency exceeds the current frequency. In this mode, the comparator system 74 is configured to compare the counters 1–4 over the interval window and set:
  a) $C_1$ true when counter 3≧counter 1,
  b) $C_2$ true when counter 3≧counter 2,
  c) $C_3$ true when counter 4≧counter 1, and
  d) $C_4$ true when counter 4≧counter 2.

When any of the frequency-comparison signals $C_3$ and $C_4$ goes true, the charge pump current state machine (66 in FIG. 3) then configures its state signals (67 in FIG. 3) to indicate the wide-bandwidth state.

Because the destination frequency exceeds the current frequency, FIG. 5 illustrates an exemplary time during which the frequency of the feedback signal is increasing and approaching the destination frequency of the reference signal. In the illustrated time period, however, neither of the counters 3 and 4 reaches a count that equals or exceeds the count of either of the counters 1 and 2. Accordingly, the charge pump current state machine 66 of FIG. 3 will not change its state signals 67 to indicate the wide-bandwidth state.

It is apparent from FIG. 5, however, that in a successive comparison window (in fact, the next successive comparison window) the count of at least one of the counters 3 and 4 will equal or exceed the count of at least one of the counters 1 and 2. With the comparator configuration given above, the charge pump current state machine 66 of FIG. 3 will, in this successive comparison window, indicate the wide-bandwidth state with its state signals (67 in FIG. 3). FIG. 5 shows the feedback signal substantially in phase with the reference signal at the end of the comparison window. It is noted that this relationship is not generally true and is only employed in FIG. 5 for illustrative simplification.

In a significant feature of the invention, counts of both falling and rising edges of the VCO signal are compared to counts of both falling and rising edges of the subsequent reference signal. These processes (and corresponding structures) have been found reliable in their detection of when the VCO frequency has reached or exceeded the destination frequency. In contrast to other detection processes (e.g., comparing only rising edges or comparing only falling edges), the above-described processes provide reliable detection over all phasing relationships between the VCO and subsequent reference signals.

It was assumed above that the destination frequency exceeds the feedback frequency. If it is less than the current frequency (as indicated by the direction indicator 43), the comparator system 74 of FIG. 4 is configured to compare the counters 1–4 over the interval window and set:
  a) $C_1$ true when counter 1≧counter 3,
  b) $C_2$ true when counter 1≧counter 4,
  c) $C_3$ true when counter 2≧counter 3, and
  d) $C_4$ true when counter 2≧counter 4.

In other embodiments of the frequency discriminator 60 of FIG. 4, the width of the comparison window of FIG. 5 can be revised to increase or decrease this count and such revision adjusts the discrimination resolution of the system. For example, increasing the comparison window will average the feedback signal over a wider time period and decreasing the comparison window will average the feedback signal over a narrow time period and will, thus, enhance frequency resolution. As shown in FIG. 5, overhead time periods are preferably inserted between comparison windows to hold data, record accurate comparison results and reinitialize counters 1–4.

The comparison relationships of the comparator system 74 of FIG. 4 may be modified in various embodiments of the invention. For example, the comparator system can be programmed with an offset count so that it compares the counters 1–4 over the interval window (see FIG. 5) and sets:

a) $C_1$ true when counter 3≧(counter 1—offset count),
b) $C_2$ true when counter 3≧(counter 2—offset count),
c) $C_3$ true when counter 4≧(counter 1—offset count), and
d) $C_4$ true when counter 4≧(counter 2—offset count).

In this embodiment, the wide-bandwidth state state will be detected when the VCO frequency is just below (by approximately the offset count) or equal to the destination frequency. With similar modifications of the comparison window and the offset count, the detection of the wide-bandwidth state state can be moved to regions below, about or above the destination frequency.

Various other embodiments of the invention may be realized with different combinations of the above-described states. For example, the wide-bandwidth state state can be eliminated and the system states then proceed directly from the open-loop state to the narrow-bandwidth state state. In this embodiment, the second lock detector 64 of FIG. 3 is not needed and may be effectively turned off.

In another example, the open-loop state is eliminated and the system state proceeds directly to the wide-bandwidth state state and subsequently to the narrow-bandwidth state state. In this embodiment, the phase detector 24 of FIG. 1 remains coupled to the charge pump 26 and the transfer function of the charge pump is shifted from the wide-bandwidth state to the narrow-bandwidth state when the second lock detector 64 of FIG. 3 determines that phase lock has been acquired. In this embodiment, the frequency discriminator 20 of FIG. 3 is not needed and may be effectively turned off.

Typically, the open-loop state is eliminated only when the destination frequency is not significantly distant (e.g., relative to feedback control loop bandwidth) from the current frequency. For example, if subsequent frequencies of the variable frequency source 22 of FIG. 1 are commanded with 32 bit digital frequency tuning words (FTWs), the open-loop state might be eliminated when the previous and current frequency tuning words do not differ in the upper 12 bits and is activated otherwise.

In this example, the minimum change $\Delta f_{out(min)}$ in the variable frequency source required to enable the frequency discriminator 60 of FIG. 3 (so that the open-loop state is used) is given by $$\Delta f_{out(min)} = \Delta TW(F_s)/2^{32}$$

in which $\Delta TW$ is the minimum change in frequency tuning word ($2^{20}$) and $F_s$ is the system clock. With an exemplary system clock $F_s$ of 900 Mhz, the minimum change in $\Delta f_{out}$ required to enable the frequency discriminator is $$\Delta f_{out(min)} = 2^{20}F_s/2^{32} = F_s/2^{12} = 219.73 \text{ kHz}.$$

It is important to note that de-activation of the frequency discriminator is programmable and this is a feature that can be disabled so that the frequency discriminator is then activated regardless of the change of frequency step size.

As noted above, FIG. 5 illustrates an exemplary comparison window in which neither of the counters 3 and 4 reaches a count that equals or exceeds the count of either of the counters 1 and 2. It is apparent, however, that in the next successive comparison window the count of at least one of the counters 3 and 4 will exceed the count of at least one of the counters 1 and 2. Accordingly, the system may be programmed to shorten the next comparison window to thereby improve the system's discrimination resolution.

In embodiments of the invention, therefore, the duration of the comparison window may be varied during the time period in which the frequency discriminator is determining that frequency lock with a particular subsequent reference signal has occurred. In other embodiments of the invention, different durations of the comparison window may also be employed for locking to different subsequent reference signals of the variable frequency source. Although the frequency lock signal of FIGS. 1–3 could carry any of various descriptive names, this name indicates that the frequency of the feedback signal (33 in FIG. 1) has entered the acquisition range of the feedback control loop (38 in FIG. 1) and is substantially locked in frequency with the reference signal. The name frequency lock contrasts with the phase lock signal of FIG. 1 whose name indicates that the feedback signal and the reference signal are substantially locked in phase.

Embodiments of the frequency discriminator 60 of FIGS. 2 and 3 have been described above which involve added or altered offset counts and/or altered comparison window durations in its comparator system (74 in FIG. 4). Such additions and alterations may be communicated to the frequency discriminator from other elements of the feedback control system (e.g., along signal path 78 from the charge pump current state machine 26 in FIG. 3).

In the system and method embodiments above, it was assumed that the feedback network 32 of FIG. 1 did not alter the frequency of the VCO's output signal. Accordingly, this signal (or the equivalent feedback signal 33) was compared in the phase detector 24 to the current and subsequent reference signals 33 of the variable frequency source 22. When the feedback network 32 is configured to alter the VCO's frequency (e.g., with a frequency divider or a mixer), it is the altered frequency (i.e., the frequency of the feedback signal 33) that is compared to the current and subsequent reference signals of the variable frequency source 22. Although the frequency of the VCO's output signal is now different from that of the reference signal 23, the actions of the feedback control systems of the invention bring it into phase lock (i.e., into a fixed phase relationship) with the reference signal.

The embodiments of the invention described herein are exemplary and numerous modifications, variations and rearrangements can be readily envisioned to achieve substantially equivalent results.

We claim:

1. A method of locking a feedback signal to a reference signal wherein said feedback signal has a feedback frequency that corresponds to the oscillator frequency of an output signal from an oscillator and said reference signal has a destination frequency, the method comprising the steps of:

opening a feedback control loop that includes said oscillator;

providing an open-loop drive current to a feedback filter that is coupled to said oscillator to drive said feedback frequency towards said destination frequency;

over a comparison window of time, successively comparing said feedback frequency to said destination frequency to effect a determination that said feedback frequency has entered a predetermined acquisition range of said destination frequency;

in response to said determination, terminating said open-loop drive current; and in response to said determination, closing said feedback control loop to lock said feedback signal to said reference signal.

2. The method of claim 1, wherein said comparing step includes the steps of:
over said comparison window, obtaining a reference count of edges of said reference signal;
over said comparison window, obtaining a feedback count of edges of said feedback signal; and
effecting said determination when said feedback count obtains a predetermined relationship with said reference count.

3. The method of claim 1, wherein said comparing step includes the steps of:
over said comparison window, obtaining first and second reference counts respectively of falling and rising edges of said reference signal;
over said comparison window, obtaining third and fourth feedback counts respectively of falling and rising edges of said feedback signal; and
effecting said determination when at least one of said third and fourth feedback counts obtains a predetermined relationship with at least one of said first and second reference counts.

4. The method of claim 1, wherein said closing step includes the steps of:
configuring said feedback control loop to have a first feedback bandwidth; and
in response to a subsequent phase lock between said feedback signal and said reference signal, reconfiguring said feedback control loop to have a second steady-state feedback bandwidth that is less than said first feedback bandwidth.

5. The method of claim 4, wherein said reconfiguring step is preceded by the step of successively verifying said phase lock over a predetermined time period.

6. The method of claim 4, wherein said configuring and reconfiguring steps are realized with a step of revising the transfer function of a charge pump of said feedback control loop.

7. The method of claim 1, wherein:
said opening step includes the step of disconnecting a phase detector of said feedback control loop from a charge pump of said feedback control loop; and
said closing step includes the step of reconnecting said phase detector and said charge pump.

8. The method of claim 1, wherein said providing step includes the step of reconfiguring a charge pump of said feedback control loop to supply said drive current.

9. The method of claim 1, wherein said providing step includes the step of receiving a control signal that indicates the direction of said drive current.

10. The method of claim 1, wherein said feedback frequency equals said oscillator frequency.

11. The method of claim 1, further including the step of altering said comparison window to adjust resolution of said comparing step.

12. A method of changing the feedback frequency of a feedback signal from a current frequency to a subsequent destination frequency wherein said feedback frequency corresponds to the oscillator frequency of an output signal from an oscillator, the method comprising the steps of:
with a feedback control loop that includes said oscillator, locking said feedback signal to a reference signal that has said current frequency;
revising said reference signal to have said destination frequency;
opening a feedback control loop that includes said oscillator;
providing an open-loop drive current to a feedback filter that is coupled to said oscillator to drive said feedback frequency towards said destination frequency;
over a comparison window of time, successively comparing said feedback frequency to said destination frequency to effect a determination that said feedback frequency has entered a predetermined acquisition range of said destination frequency;
in response to said determination, terminating said open-loop drive current; and
in response to said determination, closing said feedback control loop to lock said feedback signal to said reference signal.

13. The method of claim 12, wherein said comparing step includes the steps of:
over said comparison window, obtaining a reference count of edges of said reference signal;
over said comparison window, obtaining a feedback count of edges of said feedback signal; and
effecting said determination when said feedback count obtains a predetermined relationship with said reference count.

14. The method of claim 12, wherein said comparing step includes the steps of:
over said comparison window, obtaining first and second reference counts respectively of falling and rising edges of said reference signal;
over said comparison window, obtaining third and fourth feedback counts respectively of falling and rising edges of said feedback signal; and
effecting said determination when at least one of said third and fourth feedback counts obtains a predetermined relationship with at least one of said first and second reference counts.

15. The method of claim 12, wherein said closing step includes the steps of:
configuring said feedback control loop to have a first feedback bandwidth; and
in response to a subsequent phase lock between said feedback signal and said reference signal, reconfiguring said feedback control loop to have a second steady-state feedback bandwidth that is less than said first feedback bandwidth.

16. The method of claim 15, wherein said reconfiguring step is preceded by the step of successively verifying said phase lock over a predetermined time period.

17. The method of claim 15, wherein said configuring and reconfiguring steps are realized with a step of revising the transfer function of a charge pump of said feedback control loop.

18. The method of claim 12, further including the step of altering said comparison window to adjust resolution of said comparing step.

19. The method of claim 12, wherein said feedback frequency equals said oscillator frequency.

20. A feedback control system, comprising:
a voltage-controlled oscillator;
a feedback control loop that generates a feedback signal with a feedback frequency in response to said oscillator; and
a processor that:
a) opens said feedback control loop in response to a reference signal that changes from a current frequency to a destination frequency;
b) provides an open-loop drive current to said feedback control loop to drive said feedback frequency towards said destination frequency;

c) over a comparison window of time, successively compares said feedback frequency to said destination frequency to effect a determination that said feedback frequency has entered a predetermined acquisition range of said destination frequency;

d) in response to said determination, terminates said open-loop drive current; and e) in response to said determination, closes said feedback control loop about said oscillator to lock said feedback signal to said reference signal.

21. The system of claim 20, wherein said processor includes:

a first counter that obtains a reference count of edges of said reference signal over said comparison window; and a second counter that obtains a feedback count of edges of said feedback signal over said comparison window;

and wherein said processor effects said determination when said feedback count reaches a predetermined relationship with said reference count.

22. The system of claim 20, wherein said processor includes:

first and second counters that obtain first and second reference counts respectively of falling and rising edges of said reference signal over said comparison window; and third and fourth counters that obtain third and fourth feedback counts respectively of falling and rising edges of said feedback signal over said comparison window;

and wherein said processor effects said determination when at least one of said third and fourth feedback counts reaches a predetermined relationship with at least one of said first and second reference counts.

23. The system of claim 20, wherein said processor:

configures said feedback control loop to have a first feedback bandwidth; and in response to a subsequent phase lock between said feedback signal and said reference signal, reconfigures said feedback control loop to have a second steady-state feedback bandwidth that is less than said first feedback bandwidth.

24. The system of claim 23, wherein said processor successively verifies said phase lock over a predetermined time period.

25. The system of claim 23, wherein said feedback control loop includes a charge pump and said processor revises the transfer function of said charge pump to realize said first and second feedback bandwidth.

26. The system of claim 20, wherein said feedback control loop includes a phase detector and a charge pump and said processor disconnects said phase detector from said charge pump to open said feedback control loop and reconnects said phase detector to said charge pump to close said feedback control loop.

27. The system of claim 20, wherein said feedback control loop includes a charge pump and said processor reconfigures said charge pump to supply said drive current.

28. The system of claim 20, wherein said processor receives a control signal to determine the direction of said drive current.

29. The system of claim 20, wherein said feedback control loop includes:

a feedback phase detector; and a feedback network that couples said oscillator and said phase detector and that generates said feedback signal in response to said oscillator.

30. The system of claim 20, wherein said processor includes a gate system.

31. The system of claim 20, wherein said processor includes a programmable data processor.

* * * * *